United States Patent
Jiang et al.

[11] Patent Number: 5,925,914
[45] Date of Patent: Jul. 20, 1999

[54] ASYMMETRIC S/D STRUCTURE TO IMPROVE TRANSISTOR PERFORMANCE BY REDUCING MILLER CAPACITANCE

[75] Inventors: Chun Jiang; David Donggang Wu, both of San Jose, Calif.

[73] Assignee: Advanced Micro Devices, Sunnyvale, Calif.

[21] Appl. No.: 08/944,349

[22] Filed: Oct. 6, 1997

[51] Int. Cl.$^6$ ................................................ H01L 29/76
[52] U.S. Cl. ........................ 257/344; 438/163; 438/286
[58] Field of Search ................................. 257/344, 336, 257/408; 438/286, 163

[56] References Cited

U.S. PATENT DOCUMENTS

| | | | |
|---|---|---|---|
| 3,668,430 | 6/1972 | Kan | 307/235 |
| 4,380,022 | 4/1983 | Yoder | 357/22 |
| 4,585,959 | 4/1986 | Baskett et al. | 307/473 |
| 5,348,897 | 9/1994 | Yen | 437/40 |
| 5,489,540 | 2/1996 | Liu et al. | 437/30 |
| 5,580,804 | 12/1996 | Joh | 437/41 |
| 5,585,658 | 12/1996 | Mukai et al. | 257/344 |
| 5,637,902 | 6/1997 | Jiang | 257/379 |
| 5,677,224 | 10/1997 | Kadosh et al. | 257/336 |

FOREIGN PATENT DOCUMENTS

| | | | |
|---|---|---|---|
| 2214123 | 8/1990 | Japan | 257/408 |

OTHER PUBLICATIONS

IEEE Transactions on Electron Devices, vol. 41, No. 2., Feb. 1994, pp. 186–190, "An Asymmetric Sidewall Process for High Performance LDD MOSFET's" by Tadahiko Horiuchi, Tetsuya Homma, Yuikinobu Murao and Koichior Okumura.

International Electron Devices Meeting Technical Digest (IEDM), Jul. 1989, pp. 617–620, "Asymmetrical Halo Source GOLD Drain (HS–GOLD) Deep Sub–Half Micron n–MOSFET Design for Reliability and Performance" by T. N. Buti, S. Ogura, N. Rovedo, K. Tobimatsu, C.F. Codella.

*Primary Examiner*—Mark V. Prenty
*Attorney, Agent, or Firm*—Renner, Otto, Boisselle & Sklar, P.L.L.

[57] ABSTRACT

A method of making a transistor is also disclosed, including the steps of forming a gate oxide layer (106) over a semiconductor substrate (100) and forming a gate structure (108) over a portion of the gate oxide layer (106), thereby separating the transistor into a first region (114) and a second region (112) with a channel region therebetween. The method also includes forming a source region (114) having a source LDD portion (116) and forming a drain region (112) having a drain LDD portion (124) in the second region (112), wherein the drain LDD portion (124) is more shallow than the source LDD portion (1 16). An asymmetric source/drain LDD transistor structure includes a semiconductor substrate (100), a gate oxide layer (106) overlying the substrate (100) and a gate structure (108) overlying the gate oxide layer (106). The transistor structure further includes a source region (129) and a drain region (128) formed in the semiconductor substrate (100) on opposite sides of the gate structure (108) which forms a channel region therebetween. A drain LDD region (124) is disposed between the drain region (128) and the channel and a source LDD region (116) is disposed between the source region (129) and the channel, wherein the drain LDD region (124) is more shallow than the source LDD region (116).

9 Claims, 6 Drawing Sheets

ASYMMETRIC S/D STRUCTURE TO IMPROVE TRANSISTOR PERFORMANCE BY REDUCING MILLER CAPACITANCE

FIELD OF THE INVENTION

The present invention generally relates to integrated circuits and, in particular, to a device structure and method of fabrication which improves transistor performance by reducing Miller capacitance in lightly doped drain (LDD) structures.

BACKGROUND OF THE INVENTION

As is well known by those skilled in the art, large electric fields occur near the drain when a MOS transistor is operating in a saturated condition, thereby creating hot-carriers. These hot-carriers cause unacceptable performance degradation in MOS devices built with conventional drain structures when channel lengths are short. To remedy this problem, alternative drain structures such as lightly doped drain (LDD) structures have been developed. Lightly doped drains absorb some of the potential energy into the drain and thus reduce the electric field intensity.

In a typical LDD structure, the drain is formed by two implants as illustrated in prior art FIGS. 1a and 1b. One implant, as illustrated in FIG. 1a, forms LDD regions 12 and 14 which are self-aligned to the gate electrode 16. A second implant, as illustrated in FIG. 1b, forms the source/drain regions 18 and 20 which are self-aligned to the gate electrode 16 on which two oxide sidewall spacers 22 are formed. The purpose of the first implant (a lightly doped implant) is to form a lightly doped section of the drain at the edge near the channel 24. The intensity of the electric field is reduced by about thirty to forty percent using this structure because the voltage drop is shared by the drain and the channel. In a typical non-LDD drain structure, almost the entire voltage drop occurs across the lightly doped channel region of the drain. A heavier dose is removed from the channel in an LDD structure than in a conventional transistor structure; therefore the heavily doped region of the drain can be deeper without impacting device operation. The increased junction depth lowers the sheet resistance and the contact resistance of the drain.

It is always desirable to increase the speed of transistors. One factor that limits a transistor's speed is the Miller capacitance, one major component of which is the drain-gate overlap capacitance. Consequently, if it would be desirable to minimize or even to eliminate a gate-to-drain overlap capacitance of a structure, a speed of the transistor speed can be increased.

SUMMARY OF THE INVENTION

The present invention embodies an asymmetric LDD transistor structure and a method for manufacturing the same. The LDD drain region is formed by a reduced level implantation and/or subsequent anneal and is shielded when the LDD source region is supplemented with an extra implantation step. As a result, the LDD drain region is more shallow than the LDD source region and experiences substantially less lateral diffusion, thereby decreasing the gate-to-drain overlap capacitance which is a substantial component of the transistor's Miller capacitance. The supplemental LDD source implantation ensures a low LDD source region resistivity, thereby preventing degradation of the transistor's drain current. Consequently, the present invention improves the speed of the transistor without impacting the transistor's drain current.

In one aspect of the present invention, a method of making a transistor includes the steps of forming a gate oxide layer over a semiconductor substrate and forming a gate structure over a portion of the gate oxide layer, thereby separating the substrate into a first region and a second region with a channel region therebetween. The method further includes forming a source region having a source LDD portion in the first region and a drain region having a drain LDD portion in the second region. The drain LDD portion is more shallow than the source LDD portion, resulting in less lateral diffusion. The reduction in lateral diffusion reduces the drain-to-gate overlap capacitance, thereby reducing the Miller capacitance of the transistor.

In accordance with another aspect of the present invention, an asymmetric source/drain LDD transistor structure includes a semiconductor substrate, a gate oxide layer overlying the substrate and a gate structure overlying the gate oxide layer. A source region and a drain region are formed in the semiconductor substrate on opposite sides of the gate structure and thereby form a channel region therebetween. A drain LDD region is disposed between the drain region and the channel and a source LDD region is disposed between the source region and the channel. The drain LDD region is more shallow than the source LDD region, resulting in less lateral diffusion. The reduction in lateral diffusion results in a reduced gate-to-drain overlap capacitance and consequently reduces the Miller capacitance, thereby increasing the speed of the transistor.

DETAILED DESCRIPTION OF THE INVENTION

Figure 1A:
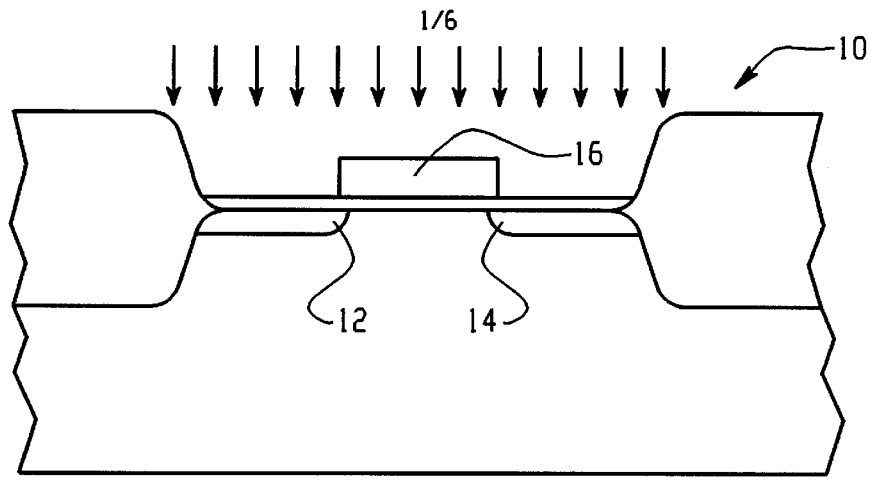
FIGS. 1a and 1b are a cross-sectional diagrams illustrating a prior art LDD transistor structure.
Figure 1B:
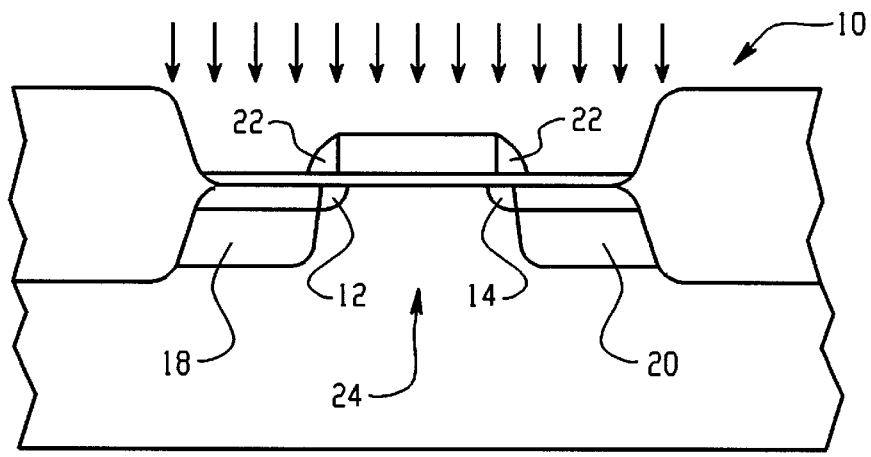
Figure 2:
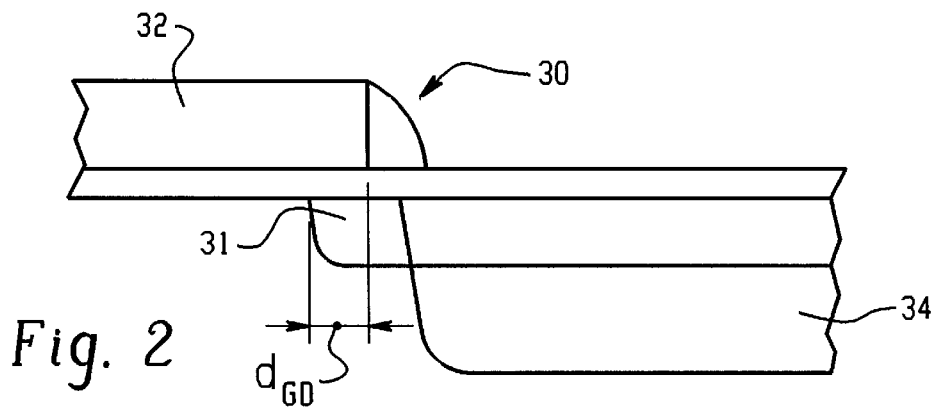
FIG. 2 is a partial cross-sectional diagram illustrating the gate-to-drain overlap capacitance of an LDD transistor structure.

The present invention will now be described with reference to the drawings wherein like reference numerals are used to refer to like elements throughout. An embodiment of the present invention includes a double spacer transistor architecture and a process for manufacturing the same. The device and method provide substantial flexibility to optimize the drain-channel junction to minimize overlap capacitance which is a major component of Miller capacitance. This overlap capacitance in LDD-type transistor structures 30 is contributed mainly by the lateral diffusion of the LDD junction 31 which overlaps the gate 32 as illustrated by $d_{GB}$ in FIG. 2.

Briefly summarizing, Miller capacitance is of primary significance on the drain side of the transistor which is the junction having a potential switching from high-to-low or low-to-high ("1" to "0" or "0" to "1"). Consequently, if the drain-gate overlap capacitance is reduced, then the overall Miller capacitance will be reduced significantly. The Miller capacitance is minimized in accordance with the invention by reducing the energy, dose or both of an LDD implant (or alternatively reducing a rapid thermal anneal (RTA) temperature) to achieve a shallow LDD drain junction which provides less lateral diffusion and consequently less overlap between the LDD region and the gate. The shallow LDD junction formation, however, is achieved in an asymmetric manner so that the source side LDD resistance is not negatively impacted; consequently the transistor drive current is not disadvantageously reduced.

FIGS. 3a–3d illustrate an embodiment for fabricating transistors employing asymmetric LDD structures. In the figures, a P-channel transistor is constructed in a silicon wafer. The present invention is illustrated in a preferred embodiment as a P-channel transistor because, in CMOS logic circuits, P-channel transistors tend to have larger widths than N-channel devices and consequently Miller capacitance is a larger problem with P-channel devices. It should be understood, however, that the present invention is equally applicable to N-channel devices which are contemplated as falling within the scope of the present invention. In addition, it should be understood that the transistor structure of this embodiment is applicable to integrated circuit devices employing any type of CMOS fabrication process.

The starting material is a silicon wafer 100. Typically, the silicon wafer 100 is a lightly doped <100> wafer or a heavily doped <100> wafer with a lightly doped epitaxial layer at the surface. A P-channel transistor is fabricated in an N-doped well 102 within the lightly doped P-substrate 100. The N-well structure 102 is formed in a conventional manner by growing a thermal oxide layer, depositing a chemical vapor deposition (CVD) nitride film, applying a mask which generally protects the silicon surface but exposes the well areas, and implanting ions into the N-well area 102. The N-well ions are driven into the silicon by high temperature cycling while an oxide layer is grown over the N-well area 102. A $V_T$ threshold-adjust implant is then applied. The surface of the silicon wafer 100 is stripped of the oxide and nitride/oxide layers and a new oxide/nitride mask layer for forming isolation structures 104 is formed. The resulting field oxide isolation regions are then grown to define active device regions for the transistor. The nitride/oxide mask layer is then removed from the active device regions and a gate oxide layer 106 is subsequently grown overlying the surface of the silicon wafer 100. A polysilicon gate layer is then deposited preferably by CVD and a mask is applied to pattern the polysilicon into a gate structure 108. Although in this embodiment a polysilicon gate material is utilized, it should be understood that polysilicon is exemplary and other materials such as metal may also be used in the present invention.

Figure 3A:
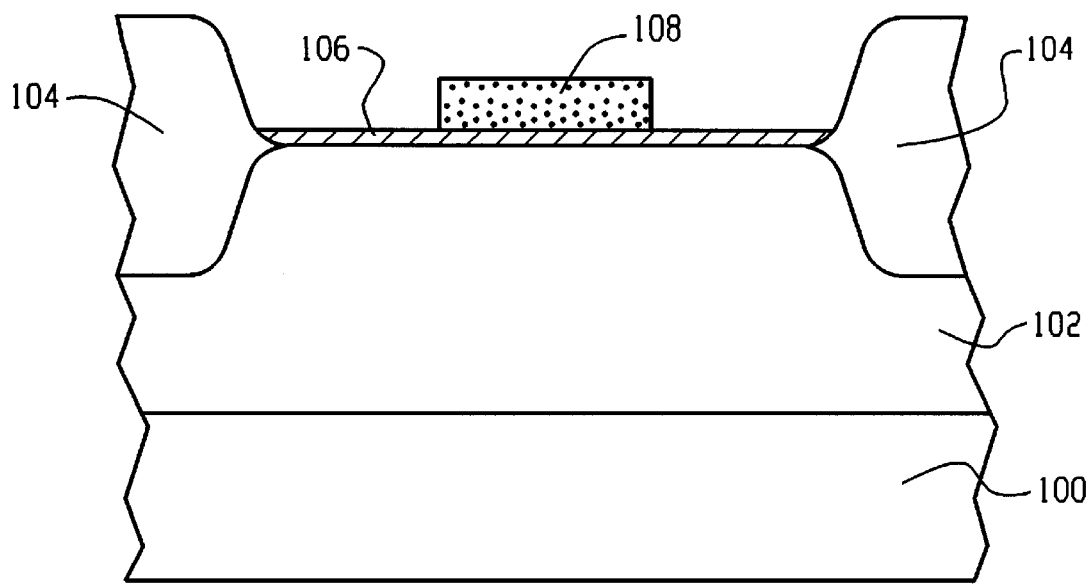
FIGS. 3a–3d are cross-sectional diagrams which illustrate various steps in forming an asymmetric LDD transistor structure in accordance with one embodiment of the present invention.

FIG. 3a shows the silicon wafer 100 after formation of the polysilicon gate structure 108 but prior to the source, drain and LDD region formation. As already discussed, the polysilicon gate 108 of the P-channel transistor is formed overlying the N-well region 102. All of the steps of the CMOS fabrication process up to and including the step of forming the gate structures are typical CMOS fabrication steps.

Figure 3B:
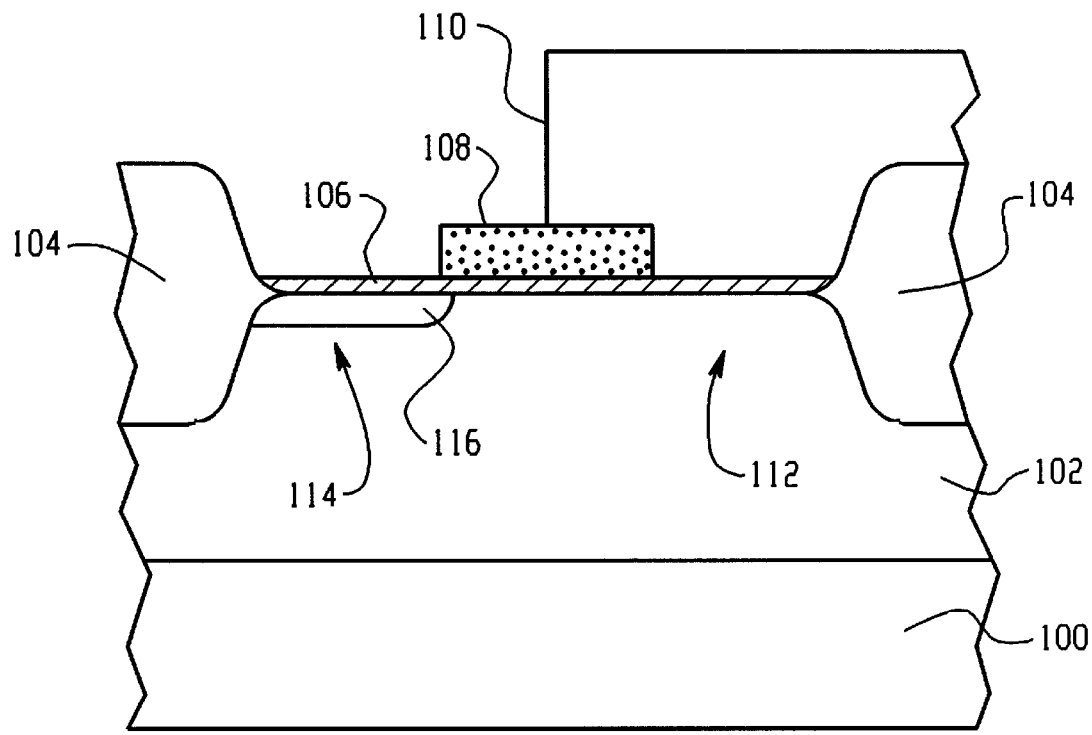

After the gate 108 is formed, a mask 110 is created to shield a drain region 112 of the transistor from a subsequent implantation step, as illustrated in FIG. 3b. In a preferred embodiment, the mask 10 is composed of a typical photoresist material of approximately 1,000 Angstroms which is formed via standard deposition etch techniques. An exposed source region 114 is then subjected to an implantation step wherein $BF_2$ ions, for example, are implanted at a dose of about $5 \times 10^{13} – 5 \times 10^{14}$ ions/cm$^2$ with an implantation energy of about 10–30 keV. This implantation step constitutes a preliminary LDD region formation step, wherein the polysilicon gate 108 is used to self-align the resultant preliminary source-LDD region 116. Note that although the preliminary source-LDD region 116 modestly overlaps with the gate 108, this capacitance is substantially insignificant because the Miller capacitance, as discussed earlier, is primarily concerned with the overlap between the gate 108 and the drain region 112. After formation of the preliminary source-LDD region 116, the mask 110 is removed using known techniques.

In the preferred embodiment, the preliminary source-LDD region 116 is formed via ion implantation. Alternatively, however, the region 116 may be formed via other semiconductor processing techniques such as projection-gas immersion laser doping (P-GILD). Any processing method by which shallow LDD regions are formed are contemplated as falling within the scope of the present invention. It is noted, however, that while the preliminary source-LDD region 116 is being formed, the drain region 112 is being shielded by, for example, a mask layer, thereby making the device fabrication asymmetric.

Subsequent the removal of the mask 110 of FIG. 3b, oxide spacers 118 are formed on the sidewalls 120 and 122 of the polysilicon gate 108. The oxide spacers are preferably formed in the following manner, although other methods for forming the oxide spacers 118 are contemplated by the present invention. A suitable thickness (about 1,000 to 2,000 Angstroms) of oxide is formed over the transistor (or alternatively over only selective portions). The sidewall spacers 118 are then formed, preferably by reactive ion etching (RIE) and are about 0.1 micron thick. After the sidewall spacer formation, a symmetric, reduced level LDD region implantation step is performed, followed by a rapid thermal anneal (RTA), wherein both the drain region 112 and the source region 114 are exposed and subjected to the implantation step.

In forming the LDD regions 124 and 126 of the drain region 112 and the source region 114, the sidewall spacers 118 act as self-aligning mechanisms for the drain-LDD region 124 and the source-LDD region 126. The LDD regions 124 and 126 are preferably formed by ion implantation. Since the drain-LDD region 124 experiences one implant while the source-LDD region 126 is subjected to two implants (this implant and the preliminary source-LDD implant), the drain-LDD region 124 is substantially more shallow than the source-LDD region 126, thereby making the transistor structure asymmetric. Consequently, the drain-LDD region 124 undergoes substantially less lateral diffusion than the source-LDD region 126. The reduced lateral diffusion of the drain-LDD region 124 results in a reduction in the gate-to-drain overlap capacitance.

Not only is the drain-LDD region 124 more shallow than the source-LDD region 126, but the drain-LDD region 124 is more shallow than prior art drain-LDD regions by reducing the dose and/or implantation energy of the implantation step from that which is typically used in prior art processes. For example, the ion implantation step of the present invention preferably implants boron or $BF_2$ P-type ions at a dose of about $5 \times 10^{13} – 5 \times 10^{14}$ ions/cm$^2$ with an implantation energy of about 10–30 keV. In contrast, typical prior art LDD formation steps typically utilize a dose greater than $5 \times 10^{14}$ ions/cm$^2$ and an implantation energy of about 30 keV. The reduced dose and energy level does not substantially impact the sheet resistance of the source-LDD region 126 since it combines with the preliminary source-LDD region 116 to provide a sufficiently high dopant concentration. As stated above, the reduced dose and energy of the implant step of FIG. 3c causes less overlap of the drain-LDD region 124 with the gate 108, thereby reducing the overlap capacitance and consequently reducing the transistor's Miller capacitance.

In the previous step of forming the source-LDD region 126 and the drain-LDD region 124, a reduced implantation dosage and energy was utilized. Alternatively, to make the drain-LDD region 124 more shallow than prior art drain-LDD regions, a reduced rapid thermal anneal (RTA) of about 1000° C. for a time period of about 10 seconds may be used in repairing the lattice damage to thereby reduce the lateral diffusion of the drain-LDD region 124 and thereby reduce the drain-gate overlap capacitance.

Figure 3C:
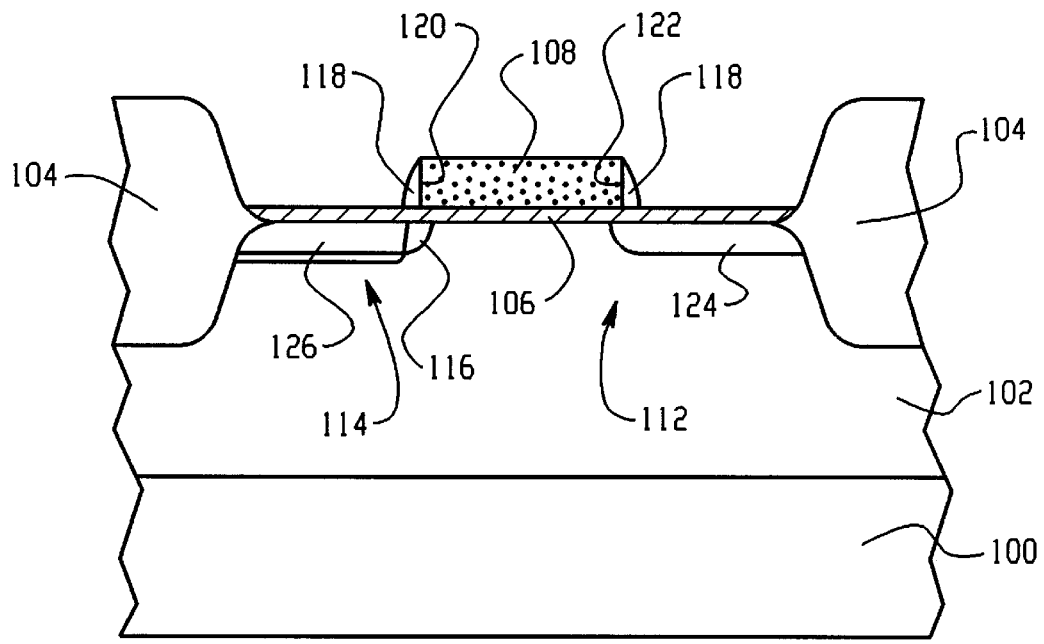
Figure 3D:
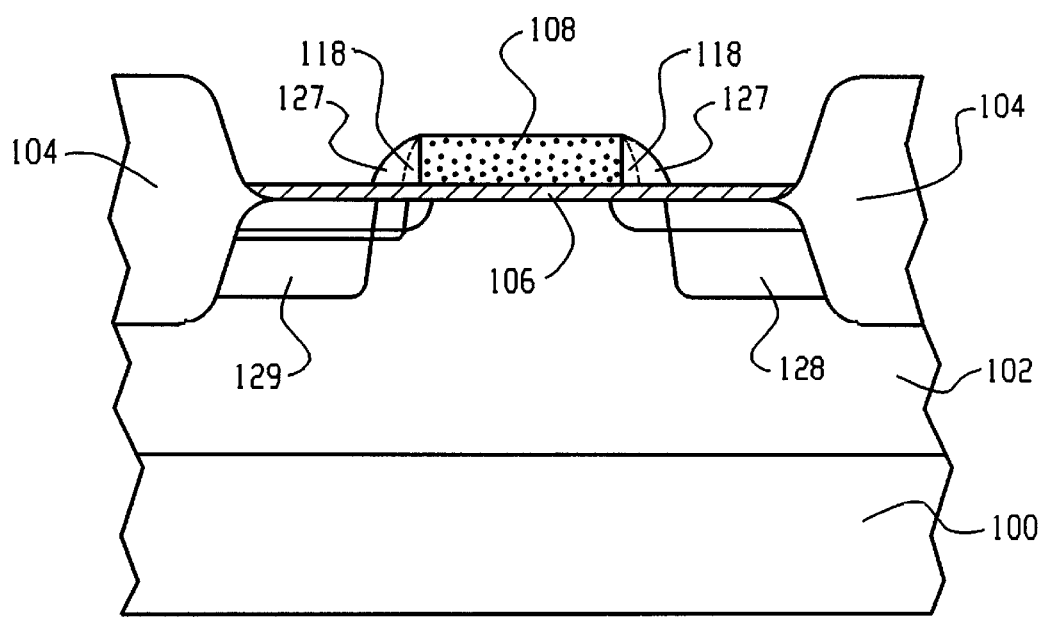

The LDD region formation is proceeded by a second sidewall spacer formation step as illustrated in FIG. 3d. Second sidewall spacers 128 are formed in a manner similar to the first spacers 118. An oxide layer of about 1,000 to 2,000 Angstroms is formed over the transistor via, for example, liquid phase oxide deposition. The second spacers 128 are then formed, preferably by reactive ion etching and are about 500–1000 Angstroms thick. Consequently, in combination with the first spacers 118, the first and second spacers 118 and 128 are about 500–1500 Angstroms thick (meaning their combined lateral width).

Using the sidewall spacers 128 as a self-aligning mask, P+ ions (using, for example, boron or BF$_2$ ions) are implanted to form a drain region 128 and a source region 129. The implantation step is preferably performed at a dose of about $5 \times 10^{14}$–$5 \times 10^{15}$ ions/cm$^2$ with an implantation energy of about 20–40 keV. Consequently, the source region 130 and the drain region 132 are self-aligned with the polysilicon gate 108 and spacers 122 and form shallow source/drain junctions. Although ion implantation is the preferred method by which the source region 130 and the drain region 132 are formed, it is understood that other semiconductor processing techniques may be employed to form the regions, such as, for example, P-GILD.

Subsequent to the formation of the drain and source regions 128 and 129, additional surface processing steps are employed to form contact layers, interconnects, passivation structures and the like, as are well known in the art of integrated circuit fabrication.

The asymmetric manner in which the LDD regions are formed in FIGS. 3a and 3d provide a drain-LDD region 124 that does not substantially overlap the polysilicon gate 108. Consequently, the drain-gate overlap capacitance which substantially contributes to the Miller capacitance is substantially reduced, thereby making the transistor operationally faster. In addition, the extra, preliminary source-LDD region allows the source LDD region to maintain a substantially low sheet resistance, thereby not negatively impacting the transistor's drive current (also commonly referred to as the drain current).

Figures 4, 6:
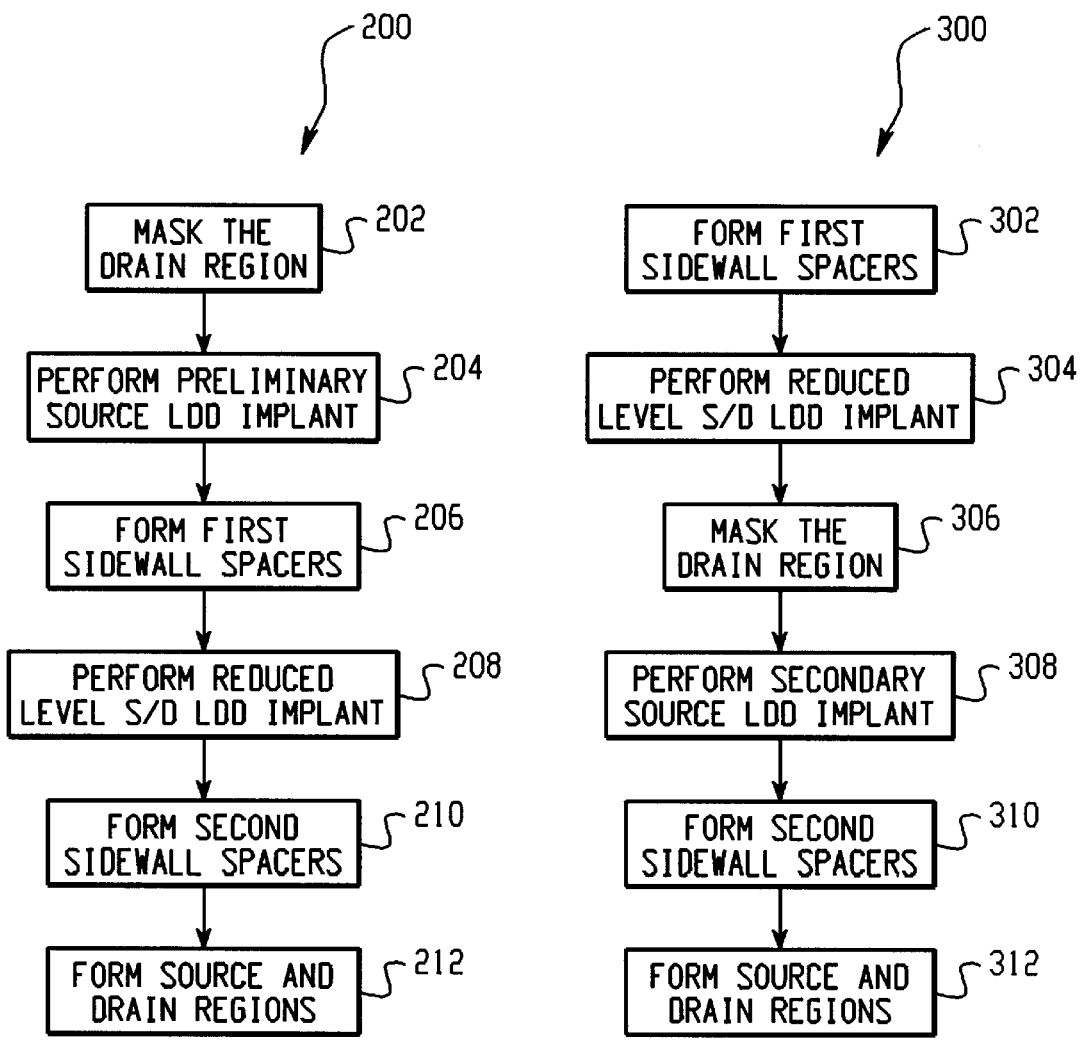
FIG. 4 is a flow chart diagram illustrating manufacturing steps in a method for forming an asymmetric LDD transistor structure in accordance with the embodiment of the present invention exemplified in FIGS. 3a–3d.
FIG. 6 is a flow chart diagram illustrating manufacturing steps in a method for forming an asymmetric LDD transistor structure in accordance with the embodiment of the present invention exemplified in FIGS. 5a–5d.

The process for fabricating the asymmetric transistor structure of FIG. 3d may be broadly characterized in an integrated circuit manufacturing process 200 as illustrated in FIG. 4. At a step 202, the drain region 112 is masked by the mask 110 as illustrated in FIG. 3b. Subsequently, at step 204, a preliminary source LDD region 116 is formed (preferably by ion implantation) in the source region 114, wherein the mask 110 shields the drain region 112 as illustrated in FIG. 3b. Once the preliminary source LDD region 116 has been formed, first sidewall spacers 118 are formed, preferably via reactive ion etching (RIE), at step 206 as illustrated in FIG. 3c.

Once the first sidewall spacers 118 are formed, a reduced level source/drain implantation is preferably used to generate the drain and source LDD regions 124 and 126, respectively at step 208. The reduced level (by either a reduced implantation dose, implantation energy level or reduced subsequent RTA temperature or time or any combination of the above) forms shallow LDD regions, wherein the drain LDD region 124 does not substantially laterally diffuse under the gate structure 108. In another alternative embodiment, other processes such as P-GILD may be used to form the LDD regions. Afterward, at step 210, a second pair of sidewall spacers 127 are formed and the drain and source regions 128 and 129 are then formed at step 212, wherein the gate 108 and sidewall spacers 127 serve to self-align the drain and source regions 128 and 129.

In an alternative embodiment of the present invention, an asymmetric source/drain LDD transistor structure may be formed as illustrated in FIGS. 5a–5d.

Figure 5A:
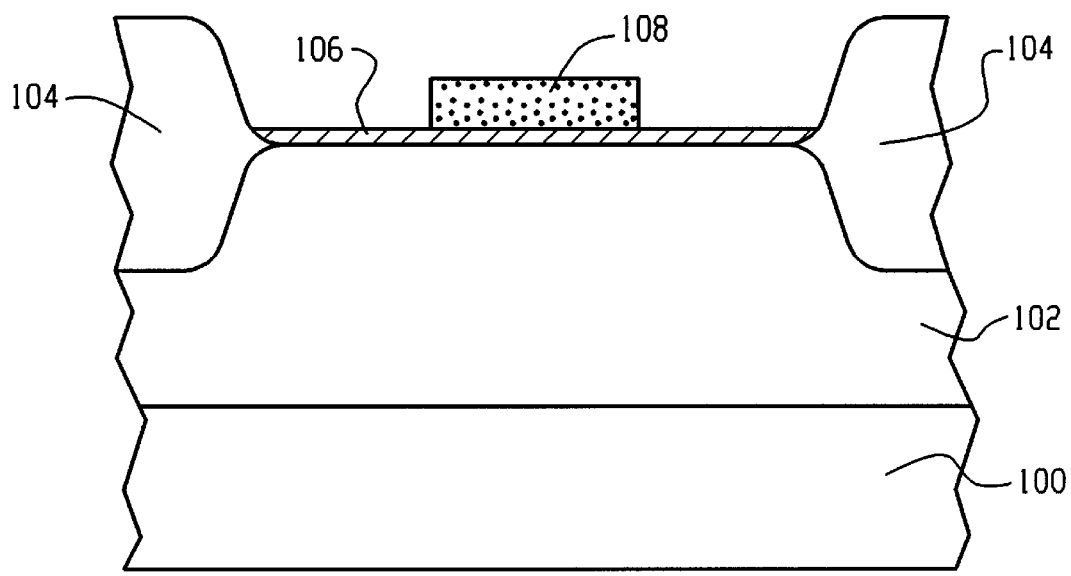
FIGS. 5a–5d are cross-sectional diagrams which illustrate various steps in forming an asymmetric LDD transistor structure in accordance with another embodiment of the present invention.
Figure 5B:
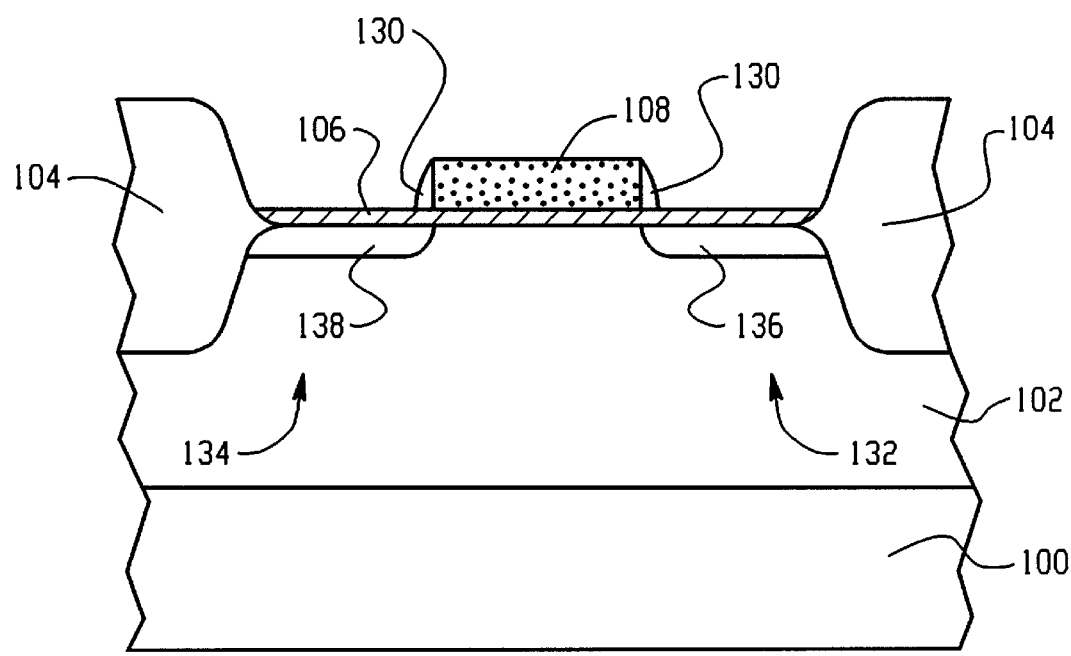

FIG. 5a, like FIG. 3a, illustrates the gate 108 formed overlying the gate oxide 106 which overlies the N-well 102. The structure illustrated in FIG. 5a is formed via standard semiconductor processing techniques as is well known by those skilled in the art. In FIG. 5b, a first pair of sidewall spacers 130 is formed on the sidewalls 122 of the gate 108. After the sidewall spacer formation 130, a reduced level LDD implant is performed to create a drain LDD region 136 and a source LDD region 138, respectively. The implant step is a reduced level implant which thereby generates shallower LDD regions that also result in a substantial reduction in lateral diffusion. Consequently, neither region 136 or 138 substantially overlap with the gate 108.

The reduced level implant step is preferably reduced from typical prior art LDD fabrication steps by reducing the impurity concentration dose to about $5 \times 10^{13}$–$5 \times 10^{14}$ ions/cm$^2$ from a typical concentration of greater than $5 \times 10^{14}$ ions/cm$^2$. In addition to, or alternatively, the implantation energy may be reduced to about 10–30 keV from a typical value of greater than 30 keV. In yet another alternative embodiment, a subsequent RTA step used to repair lattice damage from the preceding implantation may be reduced to about 900–1000° C. from a typical value of about 1000–1100° C. and/or the anneal time may be reduced to about 5–20 seconds from a typical value of about 20–30 seconds. The reduced level implant provides for a reduced gate-to-drain capacitance (and consequently Miller capacitance) by reducing the depth and lateral diffusion of the drain LDD region 136.

In yet another alternative embodiment of the present invention, the LDD regions 136 and 138 are formed with a reduced P-GILD. P-GILD provides good control because the laser energy, pulse duration and substrate temperature may be tightly controlled to provide accurate junction depths, lateral diffusions, etc. P-GILD and other LDD region formation techniques are contemplated as falling within the scope of the present invention for each of the junction formation steps.

Figure 5C:
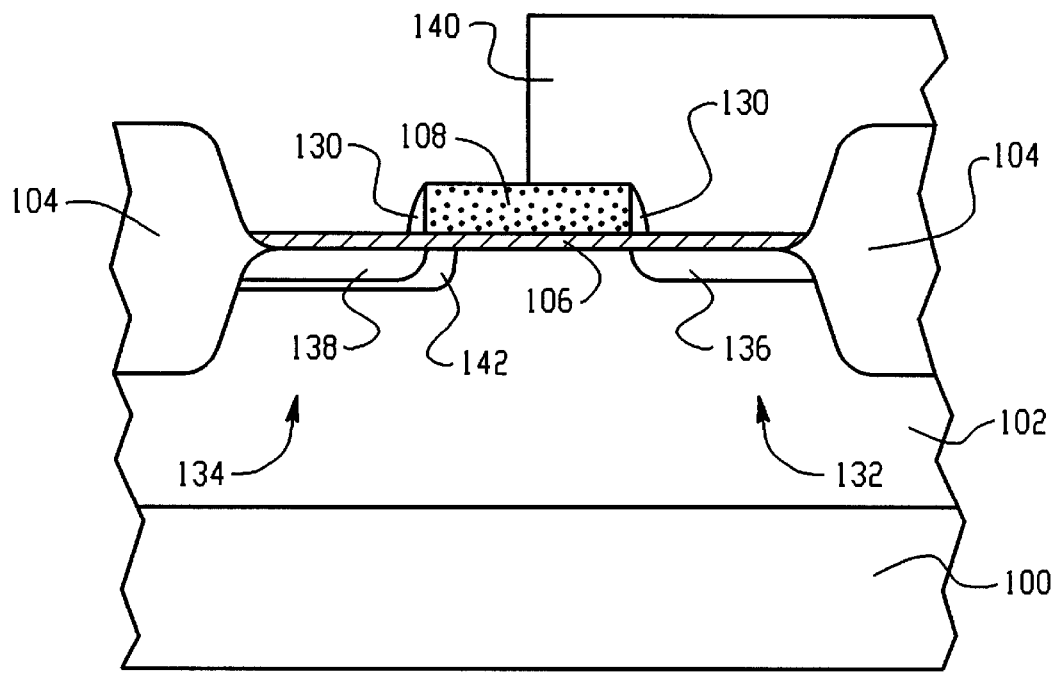

After formation of the LDD regions 136 and 138, a mask 140 is formed over the drain region 132 as illustrated in FIG. 5c to shield the LDD drain region 136 from the next processing step. A secondary source LDD implant is then performed at an impurity concentration dose of about $5\times10^{13}$–$5\times10^{14}$ ions/cm$^2$ and an implantation energy of about 10–30 keV to thereby form an extended LDD source region 142 having a substantially lower sheet resistance. The substantial reduction in the sheet resistance of the extended LDD source region 142 prevents a degradation of transistor drive current that would otherwise occur since the reduced level implant step that formed the LDD source region 138 results in the region 138 being undesirably resistive.

Figure 5D:
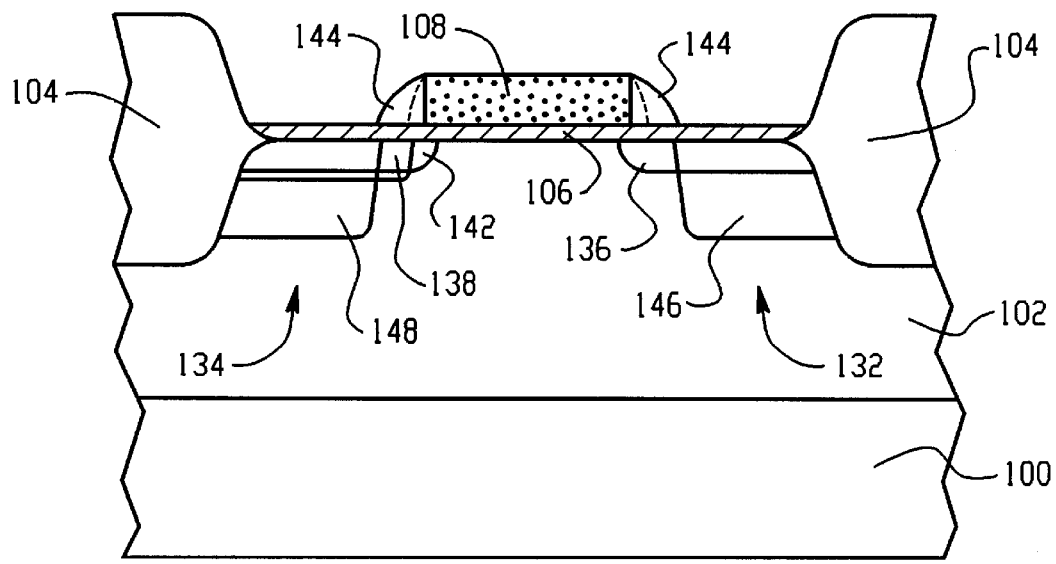

After formation of the extended LDD source region 142, the mask 140 is removed and a second pair of sidewall spacers 144 is formed as illustrated in FIG. 5d (preferably by liquid phase oxide deposition and RIE). The second sidewall spacers 144, together with the polysilicon gate 108 act as masks to self-align a drain region 146 and a source region 148 that are formed, preferably by ion implantation.

The resultant asymmetric LDD transistor structure of FIG. 5d provides a substantial improvement in speed over prior art devices by reducing the gate-to-drain capacitance which is a significant portion of the transistor's Miller capacitance. The gate-to-drain overlap capacitance is reduced by performing a reduced level implant for the drain LDD region 136 after forming the first sidewall spacers. A potential problem of reduced drive current due to increased LDD source region sheet resistance is resolved by masking the LDD drain region 136 and performing a secondary LDD source implant to lower the sheet resistance of the LDD source region.

The process for fabricating the asymmetric transistor structure of FIG. 5d may be broadly characterized in an integrated circuit manufacturing process 300 as illustrated in FIG. 6. At a step 302, the first sidewall spacers 130 are formed and a reduced level source/drain LDD implant is performed at step 304, as illustrated in FIG. 5b. Subsequently, at step 306, the mask 140 is formed to shield the drain region 132 as illustrated in FIG. 5c. Once the mask 140 is in place, a secondary source LDD region implant is performed at step 308 to form the extended source LDD region 142 as illustrated in FIG. 5c.

Once the secondary source LDD implant has been performed and the mask 140 has been removed, a second pair of sidewall spacers 144 are formed at step 310 to thereby provide the desired mask spacing for formation of the drain region 146 and source region 148 at step 312, as illustrated in FIG. 5d. Subsequent, well-known processing steps may then be utilized to form contact, passivation and metallization interconnects.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a transistor, comprising the steps of:

forming a gate oxide layer over a semiconductor substrate;

forming a gate structure over a portion of the gate oxide layer, thereby separating the substrate into a first and second region with a channel region therebetween;

forming a source region having a source LDD portion in the first region;

forming a drain region having a drain LDD portion in the second region, wherein the drain LDD portion is more shallow than the source LDD portion, and wherein the steps of forming the source and drain regions comprise the steps of:

performing a reduced level implant in the first and second regions;

performing a secondary source LDD implant in the first region, wherein the reduced level implant in the first region combines with the secondary source LDD implant to form the source LDD portion;

performing a source/drain implant in the first and second regions, wherein performing the reduced level implant comprises:

forming first sidewall spacers on lateral edges of the gate structure; and subjecting the first and second regions to ion implantation with a dose of about $5\times10^{13}$–$5\times10^{14}$ ions/cm$^2$ at an implantation energy of about 10–30 keV.

2. The method of claim 1, wherein performing the secondary source LDD implant comprises:

masking the second region; and subjecting the transistor to ion implantation, wherein the mask prevents the ions from impacting the second region.

3. The method of claim 1, wherein performing a source/drain implant comprises:

forming second sidewall spacers on the first sidewall spacers; and subjecting the first and second regions to ion implantation with a dose of about $5\times10^{14}$–$5\times10^{15}$ ions/cm$^2$ at an implantation energy of about 20–40 keV.

4. A method of making a transistor, comprising the steps of:

forming a gate oxide layer over a semiconductor substrate;

forming a gate structure over a portion of the gate oxide layer, thereby separating the substrate into a first and second region with a channel region therebetween;

forming a source region having a source LDD portion in the first region;

forming a drain region having a drain LDD portion in the second region, wherein the drain LDD portion is more shallow than the source LDD portion, wherein the steps of forming the source and drain regions comprise the steps of:

performing a preliminary source LDD implant in the first region;

performing a reduced level implant in the first and second regions by subjecting the first and second regions to ion implantation with a dose of less than $5 \times 10^{14}$ ions/cm$^2$ at an implantation energy of about 10–30 keV, wherein the reduced level implant in the first region combines with the preliminary source LDD implant to form the source LDD portion; and performing a source/drain implant in the first and second regions.

5. The method of claim 4, wherein forming the drain region having the drain LDD portion further comprises reducing a subsequent anneal time and/or temperature to about 10 seconds and about 1,000° C. respectively.

6. The method of claim 5, wherein forming the drain region having the drain LDD portion comprises annealing the region at about 900–1000° C. for about 5–20 seconds.

7. The method of claim 6, wherein performing the preliminary source LDD implant comprises:

masking the second region; and subjecting the transistor to ion implantation, wherein the mask prevents the ions from impacting the second region.

8. The method of claim 6, wherein performing a reduced level implant comprises:

forming first sidewall spacers on lateral edges of the gate structure; and subjecting the first and second regions to ion implantation with a dose of about $5 \times 10^{13}$–$5 \times 10^{14}$ ions/cm$^2$ at an implantation energy of about 10–30 keV.

9. The method of claim 8, wherein performing a source/drain implant comprises:

forming second sidewall spacers on the first sidewall spacers; and subjecting the first and second regions to ion implantation with a dose of about $5 \times 10^{14}$–$5 \times 10^{15}$ ions/cm$^2$ at an implantation energy of about 20–40 keV.

* * * * *

UNITED STATES PATENT AND TRADEMARK OFFICE
CERTIFICATE OF CORRECTION

PATENT NO. : 5,925,914

DATED : July 20, 1999

INVENTOR(S) : Jiang et al.

It is certified that error appears in the above-identified patent and that said Letters Patent is hereby corrected as shown below:

In column 4, line 1: Please replace "10" with --110--.

Signed and Sealed this

Fourteenth Day of December, 1999

Attest:

Q. TODD DICKINSON

*Attesting Officer*     *Acting Commissioner of Patents and Trademarks*